(12) United States Patent
Fericean et al.

(10) Patent No.: US 8,660,806 B2
(45) Date of Patent: Feb. 25, 2014

(54) ELECTRONIC COMPONENT FOR A SENSOR APPARATUS, SENSOR APPARATUS AND METHOD OF CONFIGURING A SENSOR APPARATUS

(75) Inventors: Sorin Fericean, Leonberg (DE); Frank Kruepl, Walddorfhaeslach (DE); Markus Fritton, Neuhausen (DE); Thomas Reider, Bonlanden (DE)

(73) Assignee: Balluff GmbH, Neuhausen (DE)

( * ) Notice: Subject to any disclaimer, the term of this patent is extended or adjusted under 35 U.S.C. 154(b) by 381 days.

(21) Appl. No.: 13/053,653

(22) Filed: Mar. 22, 2011

(65) Prior Publication Data

US 2011/0238339 A1 Sep. 29, 2011

(30) Foreign Application Priority Data

Mar. 24, 2010 (DE) .......................... 10 2010 003 221

(51) Int. Cl.
*G06F 19/00* (2011.01)
*H03K 17/945* (2006.01)

(52) U.S. Cl.
CPC .................................... *H03K 17/945* (2013.01)
USPC ............................................... 702/58; 702/65

(58) Field of Classification Search
CPC ....................................................... G06F 15/00
USPC ......................... 702/58; 324/207.15, 207.26
See application file for complete search history.

(56) References Cited

U.S. PATENT DOCUMENTS

| | | | |
|---|---|---|---|
| 4,135,124 A | 1/1979 | Buck | |
| 4,713,602 A | 12/1987 | Ueda | |
| 4,799,043 A | 1/1989 | Ueda | |
| 5,408,132 A | 4/1995 | Fericean et al. | |
| 5,436,456 A * | 7/1995 | Tucker et al. | 250/341.5 |
| 6,335,619 B1 * | 1/2002 | Schwab et al. | 324/207.26 |
| 7,124,041 B1 * | 10/2006 | Johnson et al. | 702/58 |
| 7,436,222 B2 * | 10/2008 | Shyr et al. | 327/103 |
| 7,932,847 B1 * | 4/2011 | Hsieh et al. | 341/155 |
| 8,258,777 B2 * | 9/2012 | Chen | 324/207.15 |
| 2005/0162158 A1 * | 7/2005 | Del Monte | 324/207.26 |

FOREIGN PATENT DOCUMENTS

| | | |
|---|---|---|
| DE | 36 08 639 | 9/1986 |
| DE | 36 15 452 | 11/1987 |
| DE | 36 15 463 | 11/1987 |
| DE | 38 07 484 | 9/1989 |

(Continued)

OTHER PUBLICATIONS

Machine translation of Foreign Patent DE 4200207 Robert Buck Jan. 28, 1993.*

(Continued)

*Primary Examiner* — Sujoy Kundu
*Assistant Examiner* — Corey Bailey
(74) *Attorney, Agent, or Firm* — Lipsitz & McAllister, LLC (57) ABSTRACT

The invention relates to an electronic component for a sensor apparatus comprising a first terminal device for connecting a sensitive device which is influenceable by a target, a second terminal device for the external communication, and a control device and/or an evaluation device which provides output signals, wherein the component is programmable via the second terminal device, characterized by a first programming level in which parameters for the setup of the sensor apparatus are adjustable and a second programming level in which a characteristic curve of the sensor apparatus is adjustable, wherein the first programming level is hierarchically superordinate to the second programming level and adjustments and/or possibilities of adjustment in the second programming level are a function of adjustments in the first programming level.

36 Claims, 5 Drawing Sheets

(56) References Cited

FOREIGN PATENT DOCUMENTS

| | | |
|---|---|---|
| DE | 40 06 893 | 9/1991 |
| DE | 42 00 207 | 1/1993 |
| DE | 43 31 555 | 3/1994 |
| DE | 41 23 828 | 6/1997 |
| DE | 100 25 662 | 12/2001 |

OTHER PUBLICATIONS

Machine Translation of Foreign Patent DE 10025662 Sorin Fericean Dec. 6, 2001.*

"Getting Started. Microsoft Optical Mouse Products", 2 pages, Mar. 7, 2007, XP002660117, Retrieved from the internet: URL:http://ecl.images-amazon.com/media/i3d/01/A/man-migrate/MANUAL000041361.pdf, retrieved on Sep. 27, 2011.

* cited by examiner

ELECTRONIC COMPONENT FOR A SENSOR APPARATUS, SENSOR APPARATUS AND METHOD OF CONFIGURING A SENSOR APPARATUS

This application claims the benefit of German Patent Application No. 10 2010 003 221.2 filed on Mar. 24, 2010.

The present disclosure relates to the subject matter disclosed in German Patent Application No. 10 2010 003 221.2 of Mar. 24, 2010, which is incorporated herein by reference in its entirety and for all purposes.

BACKGROUND OF THE INVENTION

The invention relates to an electronic component for a sensor apparatus comprising a first terminal device for connecting a sensitive device which is influenceable by a target, a second terminal device for the external communication, and a control device and/or an evaluation device which provides output signals, wherein the component is programmable via the second terminal device.

The invention further relates to a sensor apparatus.

Furthermore, the invention relates to a method of configuring a sensor apparatus.

DE 41 23 828 C2, or U.S. Pat. No. 5,408,132, discloses a non-contact proximity switch having an oscillating circuit influenceable by objects approaching from the outside, evaluation devices for generating an output signal as a function of an output quantity of the oscillating circuit exceeding a predetermined threshold value, an external electrical terminal for supplying a supply voltage, and at least one further external electrical terminal for output of the output signal, and digital adjustment devices for adjusting an adjustable circuit parameter. The adjustment devices are configured as freely programmable adjustment devices comprising a data memory. A demodulation circuit is provided which, on the output side, is connected to the adjustment devices and which, on the input side and via one of the external electrical terminals required for the switch function of the proximity switch, can be supplied with programming data in the form of data superimposed or modulated on the output signals and/or the electrical potentials at the respective external electrical terminals.

DE 100 25 662 A1 discloses a proximity sensor having an oscillator which is influenceable by an object adapted to approach it from the outside, evaluation devices for generating an analogue output signal as a function of a sensing distance between the object and the oscillator, and an output terminal at which the analogue output signal can be tapped. The sensor has a switchpoint evaluation unit integrated therein by means of which a digital output signal can be provided containing the information whether a detected sensing distance is above or below a predetermined switching point. An output terminal for the digital output signal is provided.

DE 42 00 207 C1 discloses an electronic switching device having at least one switching distance-determining element that is adjustable in terms of its switching distance-determining state, and at least two externally assignable terminals. The state of the switching distance-determining element and hence the switching distance is adjustable via the externally assignable terminals. Namely, at least one control signal for adjusting the state of the switching distance-determining element is obtained as a function of the connection of the switch to the power supply voltage.

DE 43 31 555 A1 discloses a proximity circuitry having means for switching between the normal operating mode and a learning mode, means for determining operating functions in the learning mode excluding overcurrent monitoring means for this purpose, and means for storing the determined operating function serving the operation of the proximity switch in the operating mode.

SUMMARY OF THE INVENTION

In accordance with an embodiment of the invention, an electronic component is provided which is universal in application.

In accordance with an embodiment of the invention, there is provided a first programming level in which parameters for the setup of the sensor apparatus can be adjusted and a second programming level in which a characteristic curve of the sensor apparatus can be adjusted, wherein the first programming level is hierarchically superordinate to the second programming level and adjustments and/or possibilities of adjustment in the second programming level are a function of adjustments in the first programming level.

The electronic component in accordance with the invention can be used for a multiplicity of different sensor apparatuses, wherein the sensor apparatuses can be of the same type (have the same type of sensitive devices) and the same type can be used for different families. It is also possible to use the electronic component for different types of sensor apparatuses having different types of sensitive devices. For example, it is possible to use the corresponding component for an inductive sensor apparatus or for a capacitive sensor apparatus. Certain basic adjustments are made in the first programming level. A characteristic curve (input/output transfer function) of the sensor can be adjusted in the second programming level.

By the corresponding adjustment capability, the electronic component can in principle be programmed at any time. Certain adjustments can be made on the "naked" electronic component. Other adjustments, such as a tuning of the analogue and/or digital characteristic curve of the sensor and/or the adjustment of a switching distance are made with the sensitive device connected. For example, it is possible to adjust the characteristic curve of the sensor when the housing is closed.

For the operation of a sensor apparatus, no other external passive or active components are required in addition to an electronic component in accordance with the invention and a sensitive device. The functionality of the sensor apparatus is implemented by the electronic component. Protective functions, for example functions to provide short-circuit protection, overload protection, reverse voltage protection, protection in the event of cable breakage, etc., can also be integrated in the corresponding electronic component.

It is possible for the sensitive device to provide analogue or digital signals to the electronic component. The electronic component, and in particular a sensor apparatus comprising the electronic component, provides analogue and/or digital signals at the second terminal device.

The electronic component in accordance with the invention has at least two programming levels. Further programming levels can be provided. For example, a third programming level is provided which is hierarchically subordinate to the second programming level and in which it is possible, for example, to adjust whether a sensor apparatus provided with the electronic component is to function as a normally closed or normally open sensor. In principle, it is also possible to provide still further programming levels, such as a fourth programming level which is then hierarchically subordinate to the third programming level. Said fourth programming level is, for example, a programming level in which adjustments can be made by a user. In principle, it is then provided for programming levels used in the fabrication and conditioning process (in particular the first programming level and the second programming level) to be irreversibly locked before a user can access a user-specific programming level, where such a programming level exists.

In particular, the first terminal device has at least one terminal for a sensitive device having one or more sensitive elements that are reactive to electromagnetic fields. Corresponding sensor signals are provided to the electronic component for further processing.

In particular, a sensor unit for driving said sensitive device is provided. The corresponding reactive sensitive device, for example an inductive sensitive device, requires drive signals. These are provided by the electronic component.

In principle, it is also possible—alternatively or additionally—for the first terminal device to comprise at least one terminal for a sensitive device for which no capability of being driven by the electronic component is provided. The sensitive device then passes corresponding signals on to the electronic component without a feedback from the electronic component to the sensitive device being necessary. Examples of such sensitive devices, which can provide analogue and/or digital signals, are sensitive devices of the inductive type, capacitive type, magnetic field-sensitive type, or sensitive devices which are sensitive to ultrasound, optical signals, microwaves, etc.

For example, the first terminal device has at least one terminal for an inductive sensitive device and/or a capacitive sensitive device and/or a magnetic field-sensitive device. The same electronic component is, therefore, adapted to a variety of uses.

In particular, the first terminal device has separate terminals for different types of sensitive devices. For example, there are sensitive devices which are of the non-switching type, such as an inductive sensitive device, and sensitive devices which are of the switching type, such as a magnetic field-sensitive device. Correspondingly, the internal circuitry of the electronic component has to be different. This can be taken into consideration by means of different terminals.

In the first programming level, basic adjustments can be performed. In particular, at least one of the following adjustments can be performed: use of the component, in particular in connection with the sensitive device, adjustments with respect to the type of sensitive device, adjustments to define characteristic data of the sensor, wherein the characteristic sensor data may comprise one or more of the following parameters: maximum output current, hysteresis of an output switching signal, signal level and detection threshold, adjustments of the adaptation to the sensitive device, configuring of pre-resistance values, configuring of step sizes for trim resistances, configuring of the course of values for trim resistances. The first programming level is a design level in which a sensor designer adjusts the basic setup parameters for the desired sensor apparatus.

In the second programming level, it is in particular possible to perform a teach-in tuning for the characteristic curve and/or a direct adjustment for the characteristic curve. The second programming level is a kind of fabrication level in which the sensor apparatus is configured for a particular application. The characteristic curve is in particular a monotonously continuous input-output transforming curve.

It is advantageous for a third programming level to be provided which is hierarchically subordinate to the second programming level and in which at least one of the following adjustments can be adjusted: type of a switching output, enabling of a switching output, switching function normally closed or normally open, mode of an indicating device. The functions or parameters adjustable in the third programming level have no effect on the parameters which are adjustable in the first and second programming levels. The third programming level is, for example, a logistic level in which certain functions are adjusted to meet customer demands. The adjustment is realized in software, so that hardware inventory cost is minimized. For example, when the enabling of a switching output is disabled, then the electronic component (with the sensitive element connected thereto) can be used as a power-saving sensitive device with no output unit enabled.

In particular, the electronic component has a third terminal device for an indicating device and/or sensor status data. Via the indicating device, statuses of the sensor apparatus or also, for example in a programming phase, statuses of the electronic component can be indicated, in particular optically.

For example, a temperature information signal can be tapped via the third terminal device. For example, a temperature-independent voltage can be tapped, and/or it is possible to tap two in particular linear temperature-dependent voltages having a rising or falling characteristic.

In an embodiment, at least one terminal is provided at which a working frequency can be tapped. Said working frequency can, for example, be utilized for the control of applications.

It is advantageous for a programming level to be lockable. This guarantees, for example, that setup adjustments of the first programming level cannot be changed in the second programming level. Provision can be made for an overall locking of all programming levels simultaneously and/or for individual lockings of individual programming levels.

In principle, it is advantageous for a programming level to be adjustable as to whether it can be locked reversibly or irreversibly. For example, it can be advantageous for programming levels to be lockable reversibly. For example, where incorrect adjustments or adjustments that are inappropriate for a particular application have been made, said adjustments can be reset and a correct adjustment can be made through new programming steps. For example, if an inappropriate characteristic curve of the sensor apparatus has been adjusted, this can then be reversed and the corresponding sensor apparatus need not be discarded. This allows the scrap percentage to be minimized.

It is advantageous for a reset function to be provided by means of which adjustments in one or several or all of the programming levels can be reset to predetermined settings (default preset). This allows an initial state to be restored quickly for one programming level or for several programming levels or for all programming levels. New adjustments can then be made. The scrap percentage can thereby be minimized, the reset action being easy to perform. In particular, the reset function is lockable.

In principle, a time at which programming is performed can be freely selected. Via the second terminal device, the programming levels can be accessed, and the programming can be performed—depending on the programming intended—either on the "naked" electronic component, when it is mounted on a circuit board, or with the housing closed.

In particular, the electronic component comprises a digital unit. For example, the digital unit contains control elements for driving a sensitive device and/or components for signal evaluation.

For example, the evaluation device, which provides output signals adapted to be processed further from signals of the sensitive device, is at least partially integrated in the digital unit.

It can be provided for the digital unit to comprise at least one of the following constituents: clock generator, memory device, central processor.

The electronic component further comprises a sensor unit which is operatively connected for signal communication with the first terminal device. The sensor unit is the one unit of the electronic component that communicates with the sensitive device directly and receives signals therefrom and/or drives the sensitive device directly.

It is advantageous for the sensor unit to comprise an oscillator. For example, it is then possible to drive an inductive sensitive device accordingly.

It is further advantageous for the sensor unit to comprise a detector for signals of the sensitive device. This allows corresponding evaluable signals to be generated.

In an embodiment, at least one terminal is provided at which analogue signals of the detector can be tapped. For example, an analogue signal can be tapped whose value (in particular direct voltage value) is proportional to a target distance.

It is further provided for the electronic component to comprise a signal conditioning unit. In said signal conditioning unit, evaluable signals can be obtained via comparator operations for example.

It is further advantageous for an output unit to be provided. The output unit communicates directly with external devices and provides output signals for example. Via the output unit, it is also possible to couple-in electrical energy.

It is advantageous for the output unit to comprise a short-circuit detector and/or an overload detector in order to protect the electronic component and a corresponding sensor apparatus in the event of short circuit. In principle, the short-circuit detector can also be used to allow the electronic component or a sensor apparatus to be programmed via corresponding signals.

It is advantageous for the electronic component to comprise a resistance device comprising at least one adjustable resistance. For example, the resistance device is connected to an oscillator. Via the resistance device, a sensor tuning operation can be performed, and in particular a characteristic curve of an inductive sensor apparatus can be adjusted.

In an embodiment, the resistance device comprises a pre-resistance device whose resistance value is adjustable. In particular, the resistance value of the pre-resistance device is adjusted in the first programming level.

It is favourable for the pre-resistance device to comprise a plurality of resistances which are connected in series and/or are connectable in series. By adjusting the number of series-connected resistances, the resistance value of the pre-resistance device can then be adjusted.

Furthermore, it is advantageous for the resistance device to have a trim resistance device, wherein the resistance value of the trim resistance device and the course of the resistance value when resistance is changed are adjustable. The trim resistance device is used to perform tuning operations for characteristic-curve adjustment or switching-point adjustment. The resistance value is in particular adjusted in the second programming level. The basic course (linear or non-linear) of the resistance value when resistance is changed is in particular adjusted in the first programming level.

In particular, the trim resistance device comprises a plurality of resistances which are connected in parallel and/or are connectable in parallel. This results in extensive possibilities of adjustment. In particular, the trim resistance device comprises a plurality of parallel-connected resistance rows, the resistance rows in turn comprising a plurality of series-connected resistances. This results in a resistance network which offers extensive possibilities of adjustment.

In particular, it is adjustable whether the course of the resistance value when resistance is changed is linear or non-linear and in particular exponential.

The resistance device forms a resistance network comprising resistances that can be connected in series and resistances that can be connected in parallel, wherein a switching combination can be adjusted. In particular, the switching combination is adjusted in the second programming level. This results in an accurate and defined tuning capability for adjusting a characteristic curve.

The component in accordance with the invention can be used as a master component for a sensor apparatus, such as an inductive sensor apparatus having an inductive sensitive device. In this case, the electronic component drives the (inductive) sensitive device and is also an end stage (back-end) for the sensor apparatus.

It is also possible for the electronic component to be used only as an end stage for a sensor apparatus and in particular not to drive the sensitive device. This is possible, for example, when the sensitive device is of the switching type and provides the electronic component with a switching signal directly. Use of the electronic component only as a back-end is also possible when the sensitive device provides an analogue signal.

Examples of switching-type sensitive devices are capacitive sensitive devices and magnetic field-sensitive devices.

In accordance with the invention, a sensor apparatus is provided comprising a component in accordance with the invention and a sensitive device (having at least one sensitive element) which is connected to the component.

In particular, the component and the sensitive device are arranged within the same housing. A target to be detected (in particular with respect to distance or approach) is positioned outside of said housing.

The sensitive device is, for example, an inductive sensitive device and/or a capacitive sensitive device and/or a magnetic field-sensitive device and/or an optically sensitive device.

In accordance with the invention, a method of configuring a sensor apparatus in accordance with the invention is provided in which setup parameters of the sensor apparatus are adjusted in the first programming level and a characteristic curve is then adjusted in the second programming level and in which the first and the second programming levels are locked.

In principle, it is possible for the first programming level to be locked after the adjustment work on the first programming level is completed and before the work in the second programming level is started. The second programming level is then locked after completion of the work therein. It is also possible for an overall locking to take place upon completion of the adjustment work in the first programming level and second programming level and any one or more other programming levels.

The method in accordance with the invention has the advantages mentioned in connection with the electronic component in accordance with the invention and the sensor apparatus in accordance with the invention.

It is further advantageous for sensor functions to be adjusted in a third programming level and for the third programming level to be locked.

The following description of preferred embodiments, taken in conjunction with the drawings, serves to explain the invention in greater detail.

DETAILED DESCRIPTION OF THE INVENTION

Figure 1:
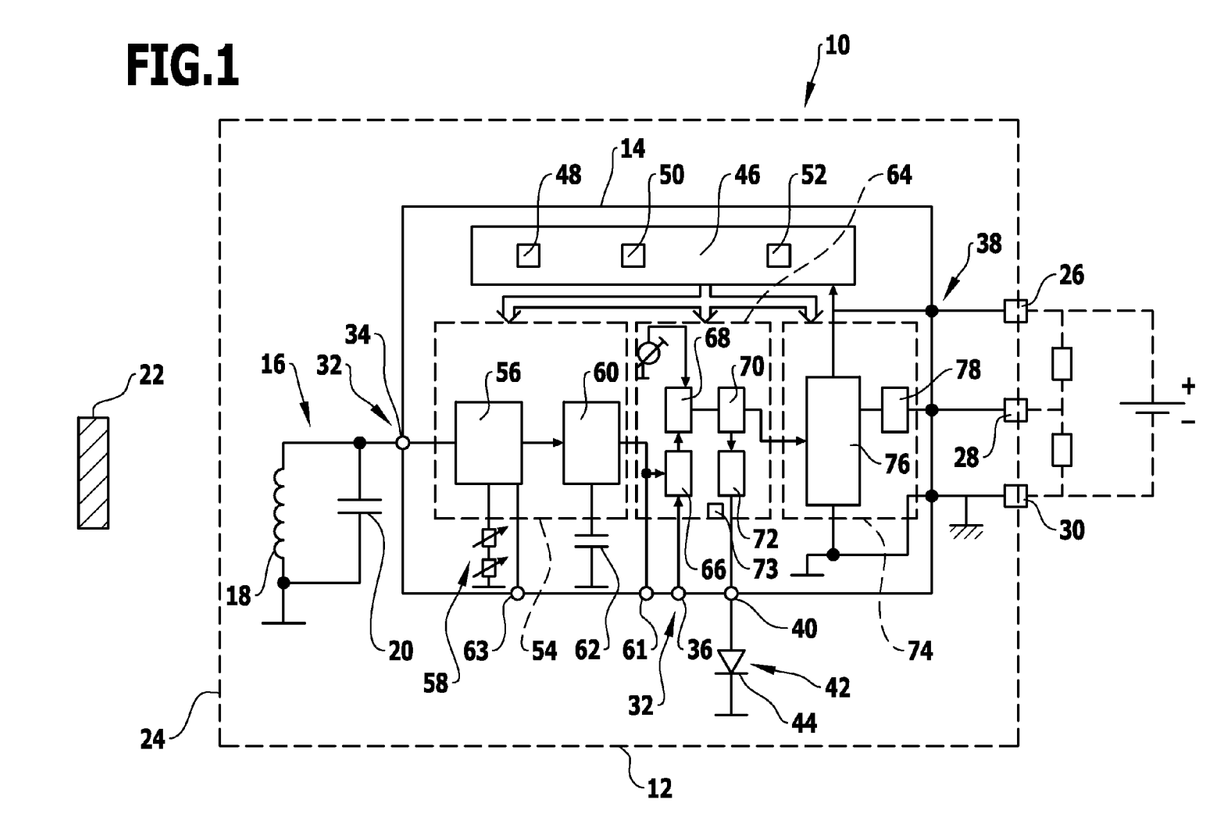
FIG. 1 is a schematic representation of an exemplary embodiment of a sensor apparatus in accordance with the invention provided with an electronic component in accordance with the invention.

An exemplary embodiment of a sensor apparatus, which is shown schematically in FIG. 1 and indicated therein by 10, comprises a housing 12. Arranged in the housing 12 are (inter alia) an electronic component 14 and a sensitive device 16.

In the exemplary embodiment shown, the sensitive device 16 is an inductive sensitive device comprising (at least) one coil 18 and (at least) one capacitor 20 which are, for example, connected in parallel. The coil 18 and the capacitor 20 form an oscillating circuit.

A target 22, and in particular a metallic target 22, outside the housing 12 influences said oscillating circuit, and via said influence it is, for example, possible to determine the distance of the target 22 from a front side 24 of the housing 12, the sensitive device 16 being arranged in the area of said front side within the housing 12.

The sensor apparatus 10 is in particular configured as a proximity sensor or distance sensor. It can provide analogue signals and/or digital signals. (In the latter case, the sensor apparatus 10 is a proximity switch.)

It is, for example, also possible for the sensitive device 16 to be formed by a voltage-controlled source which can be influenced by the target 22.

The sensor apparatus 10 has terminals 26, 28, 30 which are in particular arranged at the housing 12. The terminals 26, 28, 30 serve the external communication of the sensor apparatus 10. Via the terminals 26, 28, 30, which are in particular implemented via a plug or a mating part of a plug or via a cable, the sensor apparatus 10 can be supplied with electrical energy and sensor signals (output signals) can be tapped.

The electronic component 14 is an integrated electronic component which is the control centre and evaluation centre in the sensor apparatus 10. The electronic component 14 is, for example, an ASIC (Application-Specific Integrated Circuit).

The electronic component 14 has a first terminal device 32 to which a sensitive device can be connected. In an embodiment, the first terminal device 32 comprises a plurality of terminals 34, 36. It can be provided for separate terminals 34, 36 for different types of sensitive devices to be provided and, correspondingly, for the internal circuitry for the terminals 34, 36 at the electronic component 14 to be different.

For example, it is possible for the terminal 34 to be provided for connecting an inductive sensitive device 16 and the terminal 36 to be provided for connecting a capacitive sensitive device. For example, this allows the electronic component 14 to be used for both an inductive sensor apparatus 10 and a capacitive sensor apparatus (see below).

For example, in principle it is thereby also possible to provide a sensor apparatus 10 which comprises different types of sensitive devices, such as an inductive sensitive device and a capacitive sensitive device. Such a sensor apparatus can, for example, be used as a burr probe.

Furthermore, the electronic component 14 has a second terminal device 38 which is in operative connection for signal communication with the terminals 26, 28, 30. The second terminal device 38 serves the external communication of the electronic component 14. It can be used to supply electrical energy to the electronic component 14 and to couple-out output signals.

The electronic component 14 further comprises a third terminal device 40. At least one indicating device 42 comprising in particular one or more light-emitting diodes 44 can be connected to the third terminal device. Still further terminal devices may be provided.

Via the indicating device 42, a status indication of the sensor apparatus 10 can be implemented, for example.

The electronic component 14 has an integrated digital unit 46. By said digital unit 46, a control device is implemented which drives further components, such as a sensor unit 54, a signal conditioning device 64 and an output unit 74 (see below).

In particular, the digital unit 46 comprises the following components: clock generator 48, memory device 50 and central processor 52.

An evaluation device is in particular at least partially integrated in the digital unit 46.

The electronic component 14 further comprises a sensor unit 54. Said sensor unit 54 is operatively connected for signal communication with the first terminal device 32 and in particular with the terminal 34. It comprises an oscillator 56. Connected to the oscillator 56 is an adjustable resistance device 58. Via the resistance device 58, it is, for example, possible to adjust a characteristic curve of the sensor apparatus 10 and/or a switching distance.

The sensor unit 54 further comprises a detector 60 with a capacitor 62 connected thereto. The detector 60 detects signals which are characterized by the influence of the target 22.

In an embodiment, the detector 60 has a terminal 61 associated with it. For example, a direct voltage value that is proportional to a distance of the target 22 can be tapped at said terminal 61.

There can also be provided a terminal 63 which is connected to the oscillator 56 and at which a working frequency can be tapped.

The electronic component 14 further comprises a signal conditioning device 64. The detector 60 provides corresponding signals to said signal conditioning device 64. To this end, the signal conditioning device 64 comprises for example a changeover switch 66, for example in the form of an analogue multiplexer.

The terminal 36 is operatively connected for signal communication with the changeover switch 66.

The signal conditioning device 64 further comprises a comparator 68 arranged downstream of the changeover switch 66. The comparator 68 has a switching threshold input via which its switching threshold can be adjusted. The comparator 68 itself is followed by a logic unit 70. Arranged downstream of the logic unit 70 is a driver 72 for the indicating device 42. Said driver 72 is operatively connected for signal communication with the third terminal device 40.

In an embodiment, the signal conditioning device 64 comprises a temperature-controlled voltage source 73. Said temperature-controlled voltage source 73 provides temperature information regarding the "interiors" of the electronic component 14 and/or about the inside of the housing 12. For example, three voltages are provided, viz. a constant temperature-independent voltage and two linear temperature-dependent voltages having a rising and falling characteristic respectively.

The electronic component 14 further comprises an output unit 74. The output unit 74 has an output stage 76 to which the logic unit 70 is operatively coupled for signal communication.

In an embodiment, the output unit 74 comprises a short-circuit detector 78 and/or an overload detector which is provided for detecting short circuits or overloads respectively and protects components of the electronic component 14 upon detection of a short circuit or overload respectively.

The output unit 74 is operatively connected for signal communication with the digital unit 46. As mentioned above, the digital unit 46 drives the sensor unit 54, the signal conditioning device 64 and the output unit 74.

The electronic component 14 is programmable. Once the electronic component 14 is set to a programming mode (which is indicated via the indicating device 42 for example), parameters can then be influenced. The programming mode is achieved by a corresponding signal-biasing at the second terminal device 38. The programming is realized via signal-biasing at the second terminal device 38. The programming uses corresponding programming commands, for example in the form of multiple-bit words.

Figure 2:
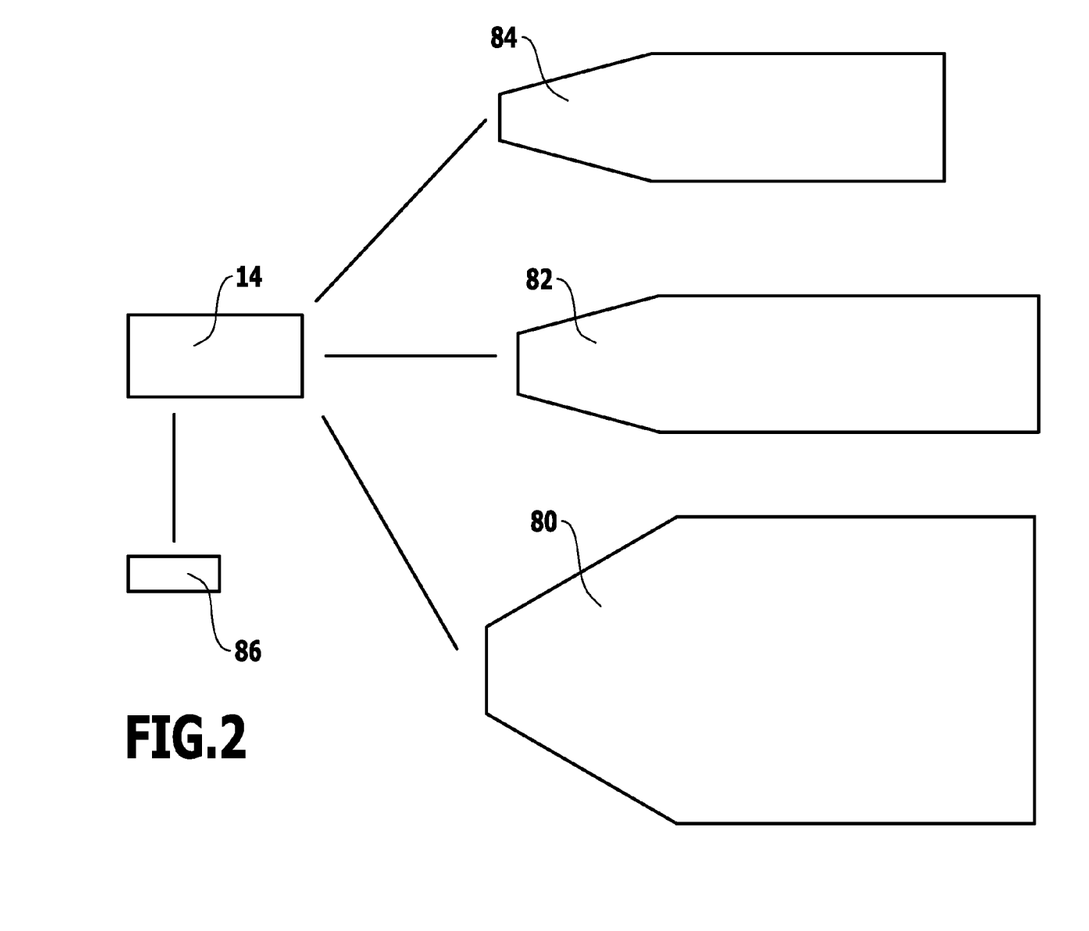
FIG. 2 is a schematic representation of programming levels for an electronic component in accordance with the invention.

The electronic component 14 comprises a plurality of programming levels 80, 82, 84 (FIG. 2).

A first programming level 80 is provided which is hierarchically superordinate to a second programming level 82. The second programming level 82 is itself hierarchically superordinate to a third programming level 84. In principle, it is possible for still further (subordinate) programming levels to be provided. The hierarchical order here means that adjustments in a subordinate programming level have no effect on the adjustments in a superordinate programming level.

In the first programming level 80, basic parameters of the sensor apparatus 10 can be adjusted. In particular, parameters for the setup of the sensor apparatus 10 can be adjusted. For example, the first programming level 80 allows an adjustment to be made as to whether the electronic component 14 is used as a control centre (master component) for a sensor apparatus 10, such as an inductive sensor apparatus 10, or as a back-end (as a kind of output stage) for a sensor apparatus having, for example, a switching-type sensitive device, such as a magnetic field-sensitive device or a capacitive device.

It is, for example, further possible in the first programming level 80 to adjust certain basic characteristic data of the sensor apparatus, such as a maximum output current, the hysteresis of an output switching signal (for example 5%, 7.5%, 10% or 15%) and/or a signal level or a detection threshold.

It is, for example, further possible to adjust an adaptation to the sensitive device 16. For example, an adaptation to the coil can be adjusted via a teach-in oscillating frequency.

Furthermore, certain basic parameters of the resistance device 58 can be adjusted. For example, a pre-resistance value can be adjusted, as will be explained in greater detail below. It is also possible, for example, to adjust the step sizes for trim resistances formed by means of the resistance device 58. It is, for example, also possible to adjust whether the course of the resistance value when resistances are changed is linear or non-linear and for example exponential.

Furthermore, it is, for example, possible to adjust a threshold for the comparator 68 via a corresponding comparator input.

The first programming level is in particular a level which is taken into consideration in the design phase of a sensor apparatus and in which a family type is adjusted.

In principle, the adjustments can be made on the "naked" electronic component 14 (before it is mounted in a housing or inserted in a circuit board) or after the component is inserted in a circuit board or mounted in the housing 12.

Once the first programming level 80 has been programmed, it can be locked. There can be a locking of adjustments in the second programming level 82, or an overall locking is realized after the adjustments in the programming levels 80, 82, 84 have been realized.

The locking can be reversible or irreversible. For example, an irreversible locking can be provided which, however, enables a reset function 86 to be performed via which the electronic component 14 can be reset to certain basic settings (default preset) in all of the programming levels 80, 82, 84.

In the second programming level 82, a characteristic curve of the sensor apparatus can be adjusted. In particular, this is realized via teach-in tuning or directly. In particular, the adjustment of the characteristic curve is performed by adjustments on the resistance device 58. The basic setup parameters for the resistance device 58 have been adjusted in the first programming level 80, as described above.

The second programming level 82 is, for example, a programming level which is accessed after the sensor apparatus 10 is completed. In the second programming level 82, the sensor apparatus 10 (with the sensitive device 16 connected thereto) can be calibrated. This makes it possible to establish the characteristic curve, i.e. the input/output transfer function. Said adjustment is made on each individual sensor apparatus 10, for example via a teach-in process. In the second programming level 82, individual piece-by-piece adjustment is realized.

The second programming level 82 is in particular lockable, with an irreversible locking being advantageous. In particular, the second programming level can be reset to its basic setting. For example, this allows an incorrect sensor calibration to be reversed.

The third programming level serves, for example, to adjust sub-classes within a sensor family (family adjustment is realized in the first programming level 80). The third programming level 84 is, for example, a logistic level. At the third programming level 84, it is possible, for example, to adjust the type of switching output (for example a high side driver (HSD), low side driver (LSD) or push-pull driver). For example, a switching function can be adjusted as to whether the sensor apparatus is normally closed or normally open. It is also possible, for example, to adjust a mode for the indicating device 42, in particular as a status indication. Furthermore, it is possible, for example, to use the third programming level 84 to realize an overall locking of the programming levels. The overall locking can be irreversible.

In principle (and by way of example), there can be a fourth programming level in which a user can make adjustments.

The programming levels 80, 82, 84 are hierarchically arranged such that adjustments in the third programming level 84 cannot change adjustments in the second programming level 82 and first programming level 80. Furthermore, adjustments in the second programming level 82 cannot modify adjustments in the first programming level 80.

In principle, it is also defined that when a programming level is not locked, corresponding programming can be performed at any time.

Figure 3:
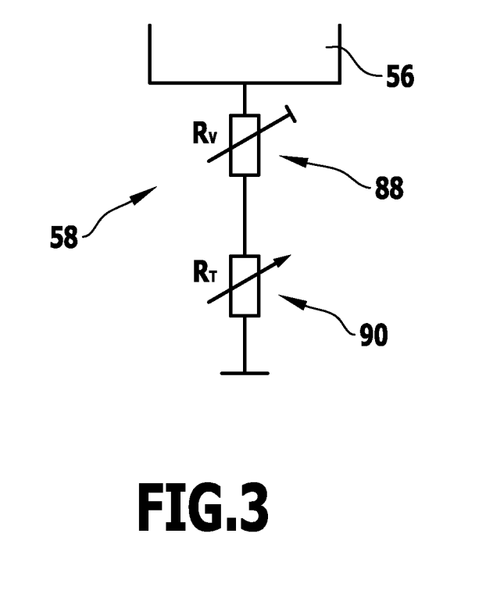
FIG. 3 is an equivalent circuit diagram of a resistance device of the electronic component in accordance with FIG. 1.
Figure 4:
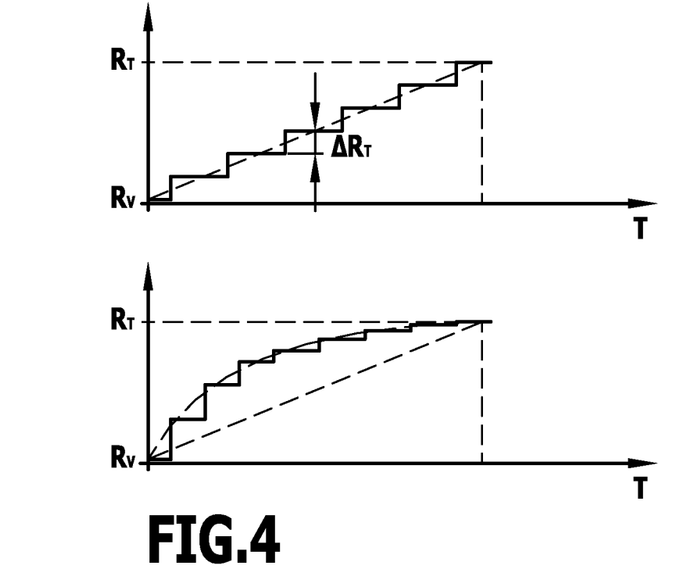
FIG. 4 shows possibilities of resistance change for the resistance device in accordance with FIG. 3.

The adjustable resistance device 58, whose equivalent circuit diagram is shown in FIG. 3, comprises an adjustable pre-resistance device 88 and an adjustable trim resistance device 90. In particular, a resistance value $R_V$ of the pre-resistance device 88 can be adjusted in the first programming level 80. Certain parameters of the trim resistance device 90 can also be adjusted in the first programming level 80. In particular, a step size $\Delta R_T$ (FIG. 4) can be adjusted. Furthermore, it is possible to adjust the course of the resistance value when resistances are changed (FIG. 4). FIG. 4 shows rising courses. In principle, the courses can also be falling.

In the second programming level 82, the resistance value $R_T$ of the resistance device 58 can be adjusted in order to carry out sensor tuning.

The pre-resistance device 88 and the trim resistance device 90 are connected in series. They form a resistance network by means of which a (digital or analogue) characteristic curve of the sensor can be adjusted in the second programming level 82.

By way of example, FIG. 4 (top) shows a typical course of a resistance value when resistance is changed during a tuning procedure. The pre-resistance value $R_V$ of the pre-resistance device 88 has been adjusted in the first programming level 80 and is not changed anymore. When tuning the sensor in the second programming level 82, the course of the resistance value when resistances are varied is linear in FIG. 4 (top).

It is also possible for the course of the resistance value when resistance is changed to be non-linear (FIG. 4, bottom) and to be for example exponential. For example, such a course can be advantageous where a non-linear relationship between a trim resistance and the resulting switching distance or measuring distance is to be compensated for.

For example, the pre-resistance device 88 comprises a series connection of M resistance elements $r_V$. A typical resistance value of such a resistance element $r_V$ is 3.2 kΩ. A multiplexer is used to connect M resistances $r_V$ in series; thus the pre-resistance value, $R_V$, is given by $R_V = M \cdot r_V$.

Figure 5:
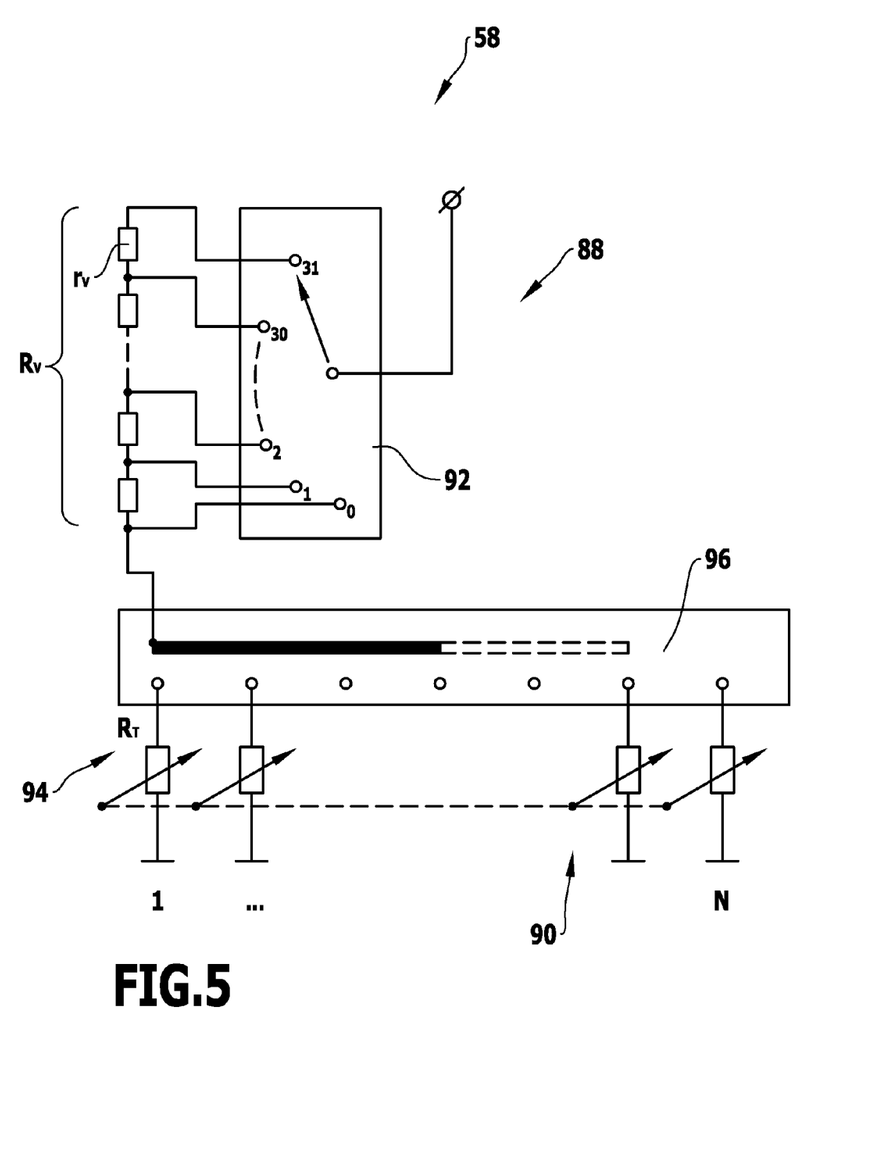
FIG. 5 shows an exemplary embodiment of a resistance device.

An embodiment of a resistance device 58, shown in FIG. 5, comprises in the pre-resistance device 88 the series-connectable resistances $r_V$ and a multiplexer 92 associated therewith via which (in the first programming level 80) an adjustment can be made as to how many resistance elements $r_V$ are connected in series.

The trim resistance device 90 comprises a plurality of rows 94, wherein in one row 94 individual resistance elements $r_E$ are connected in series. The rows 94 are parallel to each other, and a bar switch 96 is provided via which a certain number of said rows 94 can be connected in parallel. When N rows 94 are contacted, a resistance resolution $r_E/N$ can be achieved. When a linear mode for a resistance change is adjusted in the first programming level 80, i.e. when the resistance value is to go up linearly when resistances are changed in the second programming level 82, then the total resistance $R_T$ of the trim resistance device 90 is given by $T \cdot r_E/N$. The resistance value $R_T$ is increased linearly in accordance with a digital ramp (refer to FIG. 4, top). The constant step size $\Delta R_T$ of the course of the resistance value when resistance is changed is defined by N. The running variable T is adjusted in the second programming level 82 by teach-in or directly.

It is, for example also possible to provide for an exponential rise of the resistance value when resistances are changed (FIG. 4, bottom). Thus, a total resistance $R_T$ is found as $$R_T = \left[\frac{1}{T \cdot r_E} + \frac{N-1}{T_{max} \cdot r_E}\right]^{-1} \quad (1)$$

wherein $T_{max}$ denotes the maximum value of the running variable T.

The value $R_T$ is increased in steps according to an e-function. The step size is not constant.

Both the linear pattern and the non-linear pattern can be implemented by means of the same resistance network 58 and in particular by means of the same trim resistance device 90.

For example, for an exponential pattern, the resistance value in the first row 94 is increased using the variable T and the remaining rows 94 are kept at the maximum value $T_{max} \cdot r_E$.

As mentioned above, the mode for the resistance change is adjusted on the first programming level 80.

The electronic component 14 is universal in application. It can be used for different sensor families, its use being defined via the first programming level 80.

For example, it is also possible to use the electronic component 14 for a sensor apparatus 98 (FIG. 6) in which a sensitive device 102 of the switching type is arranged in a housing 100. The sensitive device 102 is, for example, a capacitive device or a magnetic field-sensitive device. In this instance, the sensitive device 102 need not be connected to the sensor unit 54 and, in particular, there is no need for an oscillator 56. The sensitive device 102 is then connected to the terminal 36 of the first terminal device 32, said terminal 36 being directly and operatively connected for signal communication with the changeover switch 66.

Figure 6:
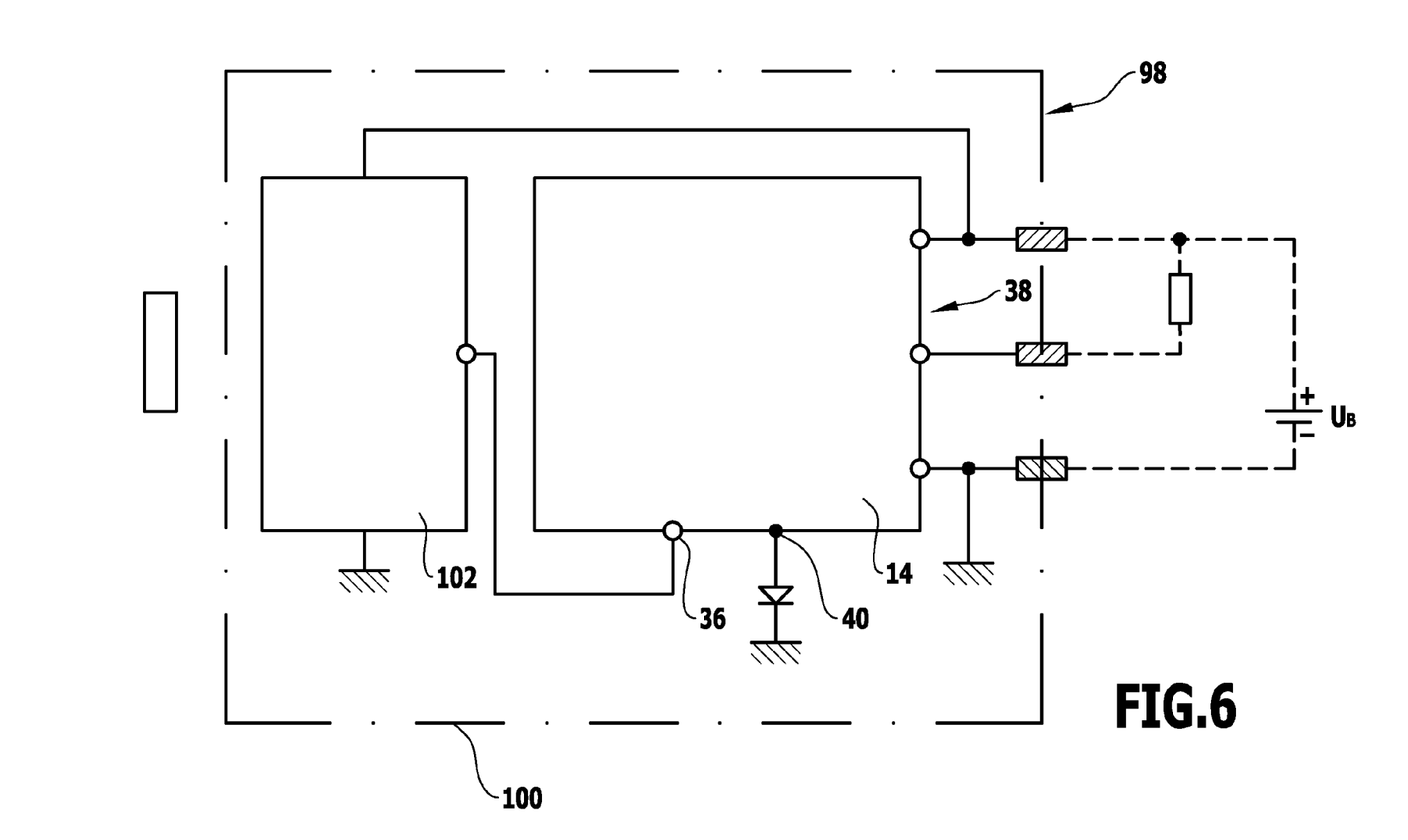
FIG. 6 shows a further exemplary embodiment of a sensor apparatus provided with an electronic component in accordance with the invention.

In this instance, the electronic component 14 is not a master component of the sensor apparatus 98, but a kind of end stage (back-end) for the sensor apparatus 98. In this case, the electronic component 14 need not drive the sensitive device 102.

The sensor apparatus 98 primarily uses the signal conditioning unit 64 and the output unit 74 of the electronic component 14.

The use of the electronic component 14 as an end stage for the sensor apparatus 98 can be adjusted in the first programming level 80. The characteristic curve of the sensor apparatus 98 can be adjusted in the second programming level 82, as described above. Certain sensor functions can be adjusted in the third programming level 84.

In accordance with the invention, an electronic component 14 is provided which is universal in application. The electronic component 14 can be used for different types of sensor apparatuses, such as inductive sensor apparatuses and capacitive sensor apparatuses. The corresponding adaptations required to suit the different uses are made in the first programming level 80.

The electronic component 14 can be used for different sensor families of the same type. The sensor family for which the electronic component 14 is used is reflected by the corresponding adjustments in the first programming level 80.

Once the corresponding adjustments in the first programming level 80 have been made, wherein said first programming level 80 is a design level, corresponding characteristic curves can be adjusted in the second programming level 82, which is a fabrication level. In principle, this process is reversible so that, for example, if a characteristic curve is adjusted incorrectly, the corresponding sensor apparatus need not be discarded but the adjustment process can be reversed and a new adjustment process performed.

The third programming level 84 allows certain sensor functions to be adjusted, such as a configuration for normally closed or normally open. Such functions are adjusted in software, so that no corresponding hardware need be held in stock.

In principle, the electronic component 14 can provide analogue and/or digital output signals. The electronic component 14 can be provided with analogue signals and/or digital signals via the corresponding sensitive device. For example, analogue signals are coupled into the electronic component 14 via the terminal 34. Analogue signals or digital signals are coupled-in via the terminal 36. In particular, digital signals are provided when the electronic component 14 is used only as a back-end in which the corresponding sensitive device is connected to the terminal 36. The electronic component 14 can then also convert analogue signals coupled into it into digital signals, with or without an evaluation functionality.

LIST OF REFERENCE CHARACTERS

10 Sensor apparatus
12 Housing
14 Electronic component
16 Sensitive device
18 Coil
20 Capacitor
22 Target
24 Front side
26 Terminal
28 Terminal
30 Terminal
32 First terminal device
34 Terminal
36 Terminal
38 Second terminal device
40 Third terminal device
42 Indicating device
44 Light-emitting diode
46 Digital unit
48 Clock generator
50 Memory device
52 Central processor
54 Sensor unit
56 Oscillator
58 Resistance device
60 Detector
61 Terminal
62 Capacitor
63 Terminal
64 Signal conditioning unit
66 Changeover switch
68 Comparator
70 Logic unit
72 Driver
73 Temperature-controlled voltage source
74 Output unit
76 Output stage
78 Short-circuit detector
80 First programming level
82 Second programming level
84 Third programming level
86 Reset function
88 Pre-resistance device
90 Trim resistance device
92 Multiplexer
94 Row
96 Bar switch
98 Sensor apparatus
100 Housing
102 Sensitive device

The invention claimed is:

1. Electronic component for a sensor apparatus, comprising:
a first terminal device for connecting a sensitive device which is influenceable by a target to the electronic component;
a second terminal device for external communication; and
at least one of a control device and an evaluation device which provides output signals;
wherein:
the electronic component is programmable via the second terminal device;
a first programming level is provided in which parameters for setup of the sensor apparatus are adjustable;
a second programming level is provided in which a characteristic curve of the sensor apparatus is adjustable, the characteristic curve comprising an input/output transfer function;
the first programming level is hierarchically superordinate to the second programming level;
at least one of adjustments and possibilities of adjustment in the second programming level are a function of adjustments in the first programming level; and
at least the first programming level is lockable.

2. Electronic component in accordance with claim 1, wherein:
the first terminal device has at least one terminal for the sensitive device,
the sensitive device has one or more sensitive elements that are reactive to electromagnetic fields.

3. Electronic component in accordance with claim 2, wherein a sensor unit is provided for driving the sensitive device.

4. Electronic component in accordance with claim 1, wherein:
the first terminal device comprises at least one terminal for the sensitive device,
the sensitive device has no capability of being driven by the electronic component.

5. Electronic component in accordance with claim 1, wherein the first terminal device has at least one terminal for at least one of an inductive sensitive device, a capacitive sensitive device and a magnetic field-sensitive device.

6. Electronic component in accordance with claim 1, wherein the first terminal device has separate terminals for different types of sensitive devices.

7. Electronic component in accordance with claim 1, wherein:
in the first programming level at least one of the following adjustments is performable: use of the electronic component, adjustments with respect to a type of sensitive device, adjustments to define characteristic data of the sensor, and
the characteristic sensor data may comprise one or more of the following parameters: maximum output current, hysteresis of an output switching signal and signal level, adjustments of an adaptation to the sensitive device, configuring of pre-resistance values, configuring of step values for trim resistances, configuring of a course of values for trim resistances.

8. Electronic component in accordance with claim 1, wherein in the second programming level at least one of a teach-in tuning for the characteristic curve and a direct adjustment for the characteristic curve is performable.

9. Electronic component in accordance with claim 1, wherein a third programming level is provided which is hierarchically subordinate to the second programming level and in which at least one of the following adjustments are adjustable: type of a switching output, enabling of a switching output, switching function normally closed or normally open, mode of an indicating device.

10. Electronic component in accordance with claim 1, wherein a third terminal device is provided for at least one of an indicating device and sensor status data.

11. Electronic component in accordance with claim 1, wherein at least one terminal is provided at which a working frequency is tappable.

12. Electronic component in accordance with claim 1, wherein at least the first programming level is adjustable as to whether it is lockable reversibly or irreversibly.

13. Electronic component in accordance with claim 1, wherein a reset function is provided by means of which adjustments in one or several or all of the programming levels are resettable to predetermined settings.

14. Electronic component in accordance with claim 1, wherein a time at which programming is performed is freely selectable.

15. Electronic component in accordance with claim 1, wherein a digital unit is provided.

16. Electronic component in accordance with claim 15, wherein the evaluation device is at least partially integrated in the digital unit.

17. Electronic component in accordance with claim 15, wherein the digital unit comprises at least one of the following constituents: clock generator, memory device, central processor.

18. Electronic component in accordance with claim 1, wherein a sensor unit is provided which is operatively connected for signal communication with the first terminal device.

19. Electronic component in accordance with claim 18, wherein the sensor unit comprises an oscillator.

20. Electronic component in accordance with claim 18, wherein the sensor unit comprises a detector for signals of the sensitive device.

21. Electronic component in accordance with claim 20, wherein at least one terminal is provided at which analogue signals of the detector are tappable.

22. Electronic component in accordance with claim 1, wherein a signal conditioning unit is provided.

23. Electronic component in accordance with claim 1, wherein an output unit is provided.

24. Electronic component in accordance with claim 23, wherein the output unit comprises at least one of a short-circuit detector and an overload detector.

25. Electronic component in accordance with claim 1, wherein a resistance device comprising at least one adjustable resistance is provided.

26. Electronic component in accordance with claim 25, wherein the resistance device comprises a pre-resistance device whose resistance value is adjustable.

27. Electronic component in accordance with claim 26, wherein the pre-resistance device comprises a plurality of resistances which are at least one of connected in series and connectable in series.

28. Electronic component in accordance with claim 25, wherein:
the resistance device comprises a trim resistance device,
the resistance value of the trim resistance device and a course of the resistance value when resistance is changed are adjustable.

29. Electronic component in accordance with claim 28, wherein the trim resistance device comprises a plurality of resistances which are at least one of connected in parallel and connectable in parallel.

30. Electronic component in accordance with claim 28, wherein it is adjustable whether the course of the resistance value when resistance is changed is at least one of linear, non-linear, and exponential.

31. Electronic component in accordance with claim 25, wherein a resistance network is provided which comprises resistances that are connectable in series and resistances that are connectable in parallel, wherein a switching combination is adjustable.

32. Sensor apparatus comprising an electric component, said electronic component comprising:
a sensitive device which is influenceable by a target;
a first terminal device for connecting the sensitive device to the electronic component;
a second terminal device for external communication; and
at least one of a control device and an evaluation device which provides output signals;
wherein:
the electronic component is programmable via the second terminal device;
a first programming level is provided in which parameters for setup of the sensor apparatus are adjustable;
a second programming level is provided in which a characteristic curve of the sensor apparatus is adjustable, the characteristic curve comprising an input/output transfer function;
the first programming level is hierarchically superordinate to the second programming level;
at least one of adjustments and possibilities of adjustment in the second programming level are a function of adjustments in the first programming level; and
at least the first programming level is lockable.

33. Sensor apparatus in accordance with claim 32, wherein the electronic component and the sensitive device are arranged within the same housing.

34. Sensor apparatus in accordance with claim 32, wherein the sensitive device is at least one of an inductive sensitive device, a capacitive sensitive device, a magnetic field-sensitive device and an optically sensitive device.

35. Method of configuring a sensor apparatus comprising an electric component, said electronic component comprising:
a sensitive device which is influenceable by a target;
a first terminal device for connecting the sensitive device to the electronic component;
a second terminal device for external communication; and
at least one of a control device and an evaluation device which provides output signals;
wherein:
the electronic component is programmable via the second terminal device;
a first programming level is provided in which parameters for setup of the sensor apparatus are adjustable;
a second programming level is provided in which a characteristic curve of the sensor apparatus is adjustable, the characteristic curve comprising an input/output transfer function;
the first programming level is hierarchically superordinate to the second programming level;
at least one of adjustments and possibilities of adjustment in the second programming level are a function of adjustments in the first programming level;
said method comprising the steps of:
adjusting the setup parameters of the sensor apparatus in the first programming level; and
then adjusting the characteristic curve in the second programming level;
wherein the first and the second programming levels are lockable.

36. Method in accordance with claim 35, wherein sensor functions are adjusted in a third programming level and the third programming level is locked.

* * * * *